US010454482B2

(12) United States Patent
Pavao Moreira et al.

(10) Patent No.: US 10,454,482 B2
(45) Date of Patent: Oct. 22, 2019

(54) DIGITALLY CONTROLLED OSCILLATOR WITH TEMPERATURE COMPENSATION

(71) Applicant: NXP USA, Inc., Austin, TX (US)

(72) Inventors: Cristian Pavao Moreira, Frouzins (FR); Didier Salle, Toulouse (FR); Olivier Vincent Doare, La Salvetat St Gilles (FR); Birama Goumballa, Larra (FR)

(73) Assignee: NXP USA, Inc., Austin, TX (US)

( * ) Notice: Subject to any disclaimer, the term of this patent is extended or adjusted under 35 U.S.C. 154(b) by 63 days.

(21) Appl. No.: 15/812,272

(22) Filed: Nov. 14, 2017

(65) Prior Publication Data

US 2018/0183442 A1    Jun. 28, 2018

(30) Foreign Application Priority Data

Dec. 22, 2016  (EP) ..................................... 16306784

(51) Int. Cl.
*H03B 5/04* (2006.01)
*H03B 5/12* (2006.01)
*H03L 1/02* (2006.01)

(52) U.S. Cl.
CPC ................. *H03L 1/02* (2013.01); *H03B 5/04* (2013.01); *H03B 5/1265* (2013.01); *H03L 1/022* (2013.01); *H03L 1/023* (2013.01); *H03B 2200/005* (2013.01)

(58) Field of Classification Search
CPC .. H03B 5/04; H03B 5/1265; H03B 2200/005; H03L 1/00; H03L 1/02; H03L 1/021; H03L 1/022; H03L 1/023; H03L 1/025; H03L 1/026; H03L 5/00; H03L 5/02
See application file for complete search history.

(56) References Cited

U.S. PATENT DOCUMENTS

| 5,705,957 A * | 1/1998 | Oka ........................ H03L 1/026 331/108 D |
| 5,874,864 A * | 2/1999 | Muto ....................... H03L 1/025 331/108 D |
| 7,371,005 B1 | 5/2008 | Ahuja et al. |
| 2007/0098041 A1* | 5/2007 | Seo .......................... G01K 7/00 374/170 |
| 2009/0231044 A1* | 9/2009 | Iwaida ..................... H03L 1/023 331/10 |

(Continued)

FOREIGN PATENT DOCUMENTS

| WO | 2014072763 A1 | 5/2014 |
| WO | 2015075496 A1 | 5/2015 |

OTHER PUBLICATIONS

U.S. Appl. No. 15/464,145, filed Mar. 20, 2017, 23 pages.

*Primary Examiner* — Levi Gannon

(57) ABSTRACT

A device comprising: a voltage reference supply, configured to provide a reference voltage that varies in response to temperature according to a predefined relationship; a temperature sensor providing a temperature signal indicating a temperature; a first controller configured to receive the temperature signal and to output a control signal; an LC-DCO receiving the reference voltage and providing an output signal with a frequency from an LC circuit, the LC-DCO comprising a switched capacitor bank configured to provide temperature compensation by varying an effective capacitance in the LC circuit in response to the control signal.

16 Claims, 10 Drawing Sheets

(56) References Cited

U.S. PATENT DOCUMENTS

| | | | |
|---|---|---|---|
| 2010/0244968 A1* | 9/2010 | Tsukizawa | H03L 1/022 |
| | | | 331/17 |
| 2010/0301910 A1 | 12/2010 | Hu et al. | |
| 2012/0326797 A1* | 12/2012 | Chiu | H03B 5/1228 |
| | | | 331/36 C |
| 2014/0266342 A1* | 9/2014 | Arai | H03L 7/099 |
| | | | 327/156 |

* cited by examiner

DIGITALLY CONTROLLED OSCILLATOR WITH TEMPERATURE COMPENSATION

CROSS-REFERENCE TO RELATED APPLICATIONS

This application claims priority under 35 U.S.C. § 119 to European patent application no. EP16306784.6, filed Dec. 22, 2016, the contents of which are incorporated by reference herein.

FIELD

The present disclosure relates to a digitally controlled oscillator with temperature compensation, and a method of compensating for temperature in a digitally controlled oscillator.

BACKGROUND

It is desirable for digitally controlled oscillators (DCOs) to have a stable output frequency. However, it is known for the output frequency of DCOs to vary with temperature. DCOs that are based on ring oscillator topologies tend to exhibit more temperature sensitivity than those that are based on an LC oscillator. Even LC oscillator based DCOs (LC-DCOs) may have too much temperature sensitivity.

It is known to try to correct temperature variation in the output frequency from a DCO. One method is to use a temperature sensor and a temperature compensation capacitor bank. This approach can improve temperature sensitivity, but temperature sensor inaccuracies and temperature dependence of analog varactors has previously made very low temperature drift (e.g. <500 ppm/K) difficult or impossible to achieve.

An improved method for stabilising the frequency of a digitally controlled oscillator in response to temperature variation is desirable.

SUMMARY

According to a first aspect, there is provided a device comprising: a voltage reference supply, configured to provide a reference voltage that varies in response to temperature according to a predefined relationship; a temperature sensor providing a temperature signal indicating a temperature; a first controller configured to receive the temperature signal and to output a control signal; an LC-DCO receiving the reference voltage and providing an output signal with a frequency from an LC circuit, the LC-DCO comprising a switched capacitor bank configured to provide temperature compensation by varying an effective capacitance in the LC circuit in response to the control signal.

The voltage reference supply may comprise a programmable slope voltage generator.

The predefined relationship may comprise a substantially linear relationship, so that the reference voltage varies substantially linearly in response to changes in temperature.

The switched capacitor bank and first controller may be configured to correct a non-linear frequency error in response to temperature and the predefined relationship may be selected to correct a linear frequency error in response to temperature.

The non-linear frequency error may be substantially quadratic.

The switched capacitor bank may have a capacitive divider topology.

The switched capacitor bank may comprise a plurality of switched varactors.

The LC-DCO may comprise a low dropout regulator LDO, the LDO configured to receive the reference voltage and to provide a supply voltage (derived from the reference voltage) for the LC-DCO.

The temperature sensor may be configured to provide an analog temperature signal, and the first controller may comprise an analog to digital converter.

The first controller may be configured to output a digital control signal, and the switched capacitor bank may be configured to vary the effective capacitance in response to the digital control signal.

The device may further comprise a second controller, configured to provide a second control signal to the voltage reference supply that defines the predefined relationship.

The temperature sensor may comprise: a first current generator configured to generate a current proportional to absolute temperature, PTAT; a second current generator configured to generate an inverse current proportional to absolute temperature, IPTAT, the PTAT current and IPTAT current being combined to form a reference current having a temperature sensitivity; a plurality of current mirrors to adjust the sensitivity and gain of the reference current; and a variable resistor to set the temperature signal based on the generated current.

According to a second aspect, there is provided a method of correcting a frequency variation in an output signal of a DCO according to the first aspect in response to a temperature variation, comprising; setting the predefined relationship so as to minimise, when the temperature compensation using the switched capacitor bank is disabled, the difference between the frequency of the output signal at a low temperature and the frequency of the output signal at a high temperature; enabling temperature compensation using the switched capacitor bank.

Setting the predefined relationship may comprise: determining the frequency of the output signal at a low temperature for each of a plurality of different predefined relationships; determining the frequency of the output signal at a high temperature for each of the plurality of different predefined relationships; selecting the predefined relationship that results in the smallest difference in the frequency of the output signal between the high and low temperatures.

The method may further comprise, at a mid-point temperature, setting the switched capacitor bank to mid-code, and adjusting the output signal frequency to match a desired frequency.

Each feature of each aspect may be combined with the features of each other aspect, as appropriate.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
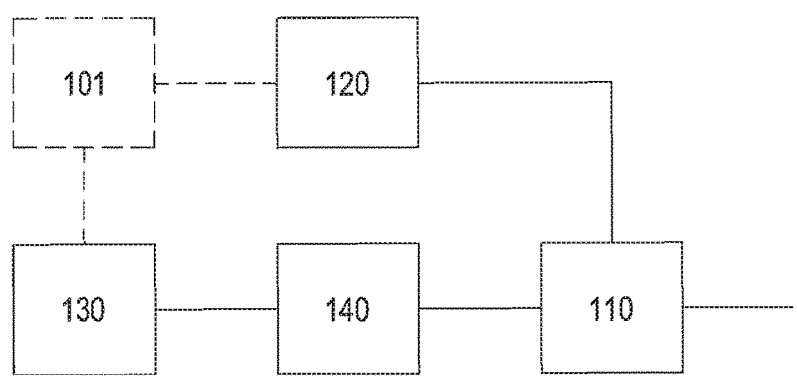
FIG. 1 is schematic block diagram of an example device.

It should be noted that the figures are diagrammatic and not drawn to scale. Relative dimensions and proportions of parts of these figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

FIG. 1 is a device according to an embodiment, comprising: a digitally controlled oscillator 110, voltage reference supply 120, first controller 140, temperature sensor 130 and a temperature reference 110.

The voltage reference supply 120 is configured to provide an output reference voltage that varies in response to temperature according to a predefined relationship. The output reference voltage is provided to the DCO 110. The supply voltage for the DCO is derived from the reference voltage. The variation in the voltage reference supply is used to reduce the temperature sensitivity of the output frequency of the DCO 110.

The temperature sensor 130 is configured to provide a temperature signal, indicating a temperature, to the first controller 140.

The first controller 140 uses the temperature signal to determine a control signal for controlling a temperature compensation capacitor bank of the DCO 110. The control signal causes the temperature compensation capacitor bank of the DCO 110 to reduce the temperature sensitivity of the DCO 110.

The contributions to reducing temperature sensitivity from adjusting the DCO supply voltage and varying the capacitance of the temperature compensation capacitor bank are complementary. The temperature sensitivity of a typical DCO may include a linear component and a non-linear component. It is difficult to completely correct for both these components of error with a temperature slope on a voltage supply, because this would require a complex and accurately defined relationship between supply voltage and temperature, which would be complex and expensive to implement. Similarly, it is difficult to satisfactorily correct for temperature sensitivity using only a temperature compensating switched capacitor bank. Prior art temperature compensation capacitor banks have either been insufficiently temperature stable, or have had insufficient accuracy and resolution to adequately stablise the output of the DCO with temperature.

Combining both supply voltage compensation with a temperature compensating capacitor bank achieves a synergistic effect: the supply voltage compensation is inherently well suited to removing linear temperature sensitivity, and a temperature compensating capacitor bank can subsequently be designed to remove the non-linear (e.g. parabolic) temperature sensitivity.

The non-linear frequency error in an LC-DCO may arise substantially from changes in capacitance as a function of temperature. Since the natural frequency of an LC resonator is proportional to the square root of the capacitance, a (typical) substantially linear relationship between the capacitance and temperature results in a quadratic term in the variation of frequency with temperature. The combination of linear error (which is also typical) and quadratic error has previous been difficult to remove. Once the linear error term has been removed (e.g. by temperature compensation on the voltage supply), it becomes more straightforward to compensate for the change in capacitance with temperature of the DCO with a switched capacitor bank. A fixed amount of capacitance can be added or taken away with a temperature compensation capacitor bank with each step in temperature.

The example device shown in FIG. 1 also includes a temperature reference 101, configured to provide an output signal with a well-defined temperature coefficient factor (TCF). This is a convenient way to provide the temperature sensor 130 and the voltage reference supply 120 with a temperature referenced signal, but other arrangements may be used. The TCF defines a linear relationship between the signal and the temperature, typically measured in ppm/K.

Figure 2:
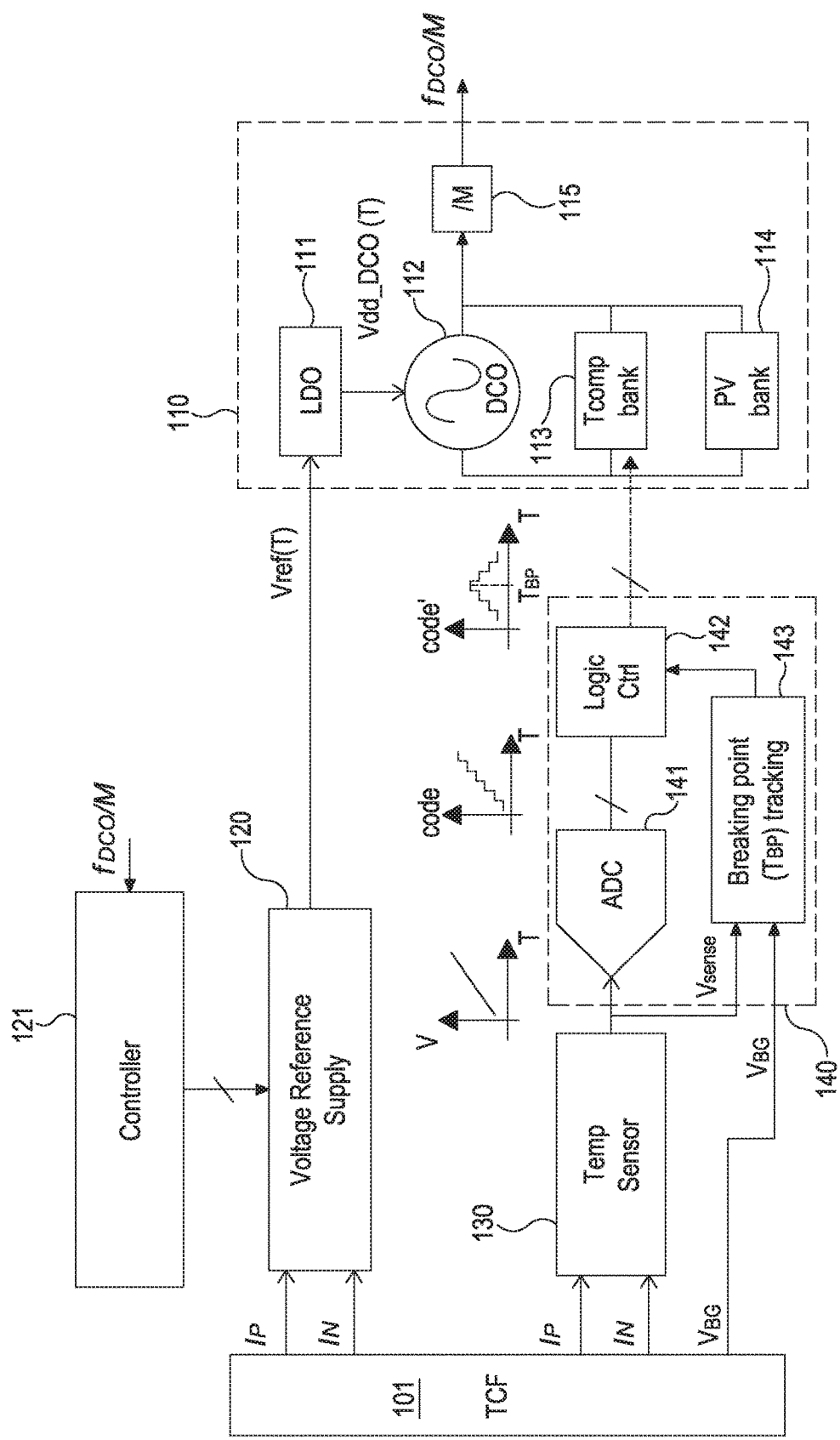
FIG. 2 is a schematic block diagram showing an example device in more detail.

FIG. 2 illustrates an example device in more detail. In common with FIG. 1, the example device again comprises a digitally controlled oscillator 110, voltage reference supply 120, first controller 140, temperature sensor 130, temperature reference 101. These features operate as described with reference to FIG. 1. A second controller 121 is also shown in FIG. 2.

The voltage reference supply 120 is a programmable slope voltage generator, which receives a digital control signal from the second controller 121. This digital control signal defines the relationship between the reference voltage Vref(T) and temperature. For example, the digital control signal 120 from the second controller 121 may define a linear relationship in terms of a slope of Vref(T) (e.g. in ppm/K). The resolution with which the slope may be defined may, for example be units of 100 ppm, 50 ppm or 25 ppm. A compromise must be struck between the resolution and accuracy with Vref(T) can be defined, and the cost and complexity of the voltage reference supply 120.

The Vref(T) supply voltage from the voltage reference supply is provided to a low dropout voltage regulator LDO, of the DCO 110, which generates a stabilised supply voltage Vdd_DCO for supplying the core of the LC-DCO 110. The voltage reference supply 120 may be substantially as described in WO2015/075496A1.

The DCO 110 comprises the LDO 111, which provides a regulated supply voltage Vdd_DCO to a LC oscillator 112 of the DCO. The oscillator 112 comprises an inductance and a capacitance that together forms an LC resonator which defines the output frequency of the DCO 110. The frequency of the output from the DCO 110 may be set based on a control signal (not shown) that sets the desired output frequency (e.g. by switching capacitors in and out of the LC resonator circuit). A frequency divider 115 may be provided at the output of the DCO 110, to provide a lower output frequency and/or a selectable frequency based on the value of the divider M.

The DCO 110 further comprises a PV capacitor bank 114, for tuning out process variation (e.g. in the capacitors or inductors) in the DCO, so as to re-centre the output frequency of the DCO. In parallel with the PV capacitor bank 114, there is provided a temperature compensation capacitor bank 113, which is operable to reduce temperature sensitivity in the frequency of the output of the DCO 110 (e.g. $f_{DCO}/M$).

The temperature compensation capacitor bank 113 is configured to change the effective capacitance of the LC resonator of the DCO 112 by switching capacitors or varactors into and out of the resonant circuit in response to a digital control signal provided by the first controller 140. The operation of an example temperature compensation capacitor bank will be described in more detail later, with reference to FIG. 3.

The first controller 140 is configured to receive an analog temperature signal from the temperature sensor 130, and comprises: ADC 141, breaking point tracking module 143, and control logic 142. The ADC 141 receives the temperature signal and converts it into a digital temperature signal. The digital temperature signal is provided to the control logic 142. The breaking point tracking module determines whether the (analog) temperature signal has reached a threshold (which may be selectable), and provides a break point signal indicating this (e.g. true or false). The breaking point tracking module 143 may receive a reference voltage (for example a bandgap referenced voltage $V_{BG}$), and may comprise a comparator for comparing the temperature signal $V_{sense}$ with the reference voltage $V_{BG}$.

The control logic 142 receives the digital temperature signal from the ADC 141 and the break point signal from the breaking point tracking module 143, and provides a digital control signal that is determined using both these signals. The control logic 142 outputs the digital control signal to the temperature compensation capacitor bank which switches capacitors in response. In one example, increasing temperature causes the control signal to increase in value (e.g. linearly) until the breakpoint temperature is reached, at which point further increases in temperature result in a decrease (e.g. linear) in the control signal. The compensation function (i.e. the control signal as a function of temperature) may be substantially symmetric about the break point temperature (e.g. with the upward slope equal to the downward slope). This arrangement is a particularly elegant way to compensate for non-linear DCO temperature sensitivity, especially in combination with a temperature compensated DCO voltage supply.

The temperature reference 101 may be substantially as described in U.S. Pat. No. 9,395,740 B2.

The temperature sensor 130 may comprise a first current generator configured to generate a current proportional to absolute temperature, PTAT; a second current generator configured to generate an inverse current proportional to absolute temperature, IPTAT. The PTAT current and IPTAT current being combined to form a reference current having a temperature sensitivity. The temperature sensor may include a plurality of current mirrors to adjust the sensitivity and gain of the reference current and a variable resistor to set the temperature signal based on the generated current.

Figure 3:
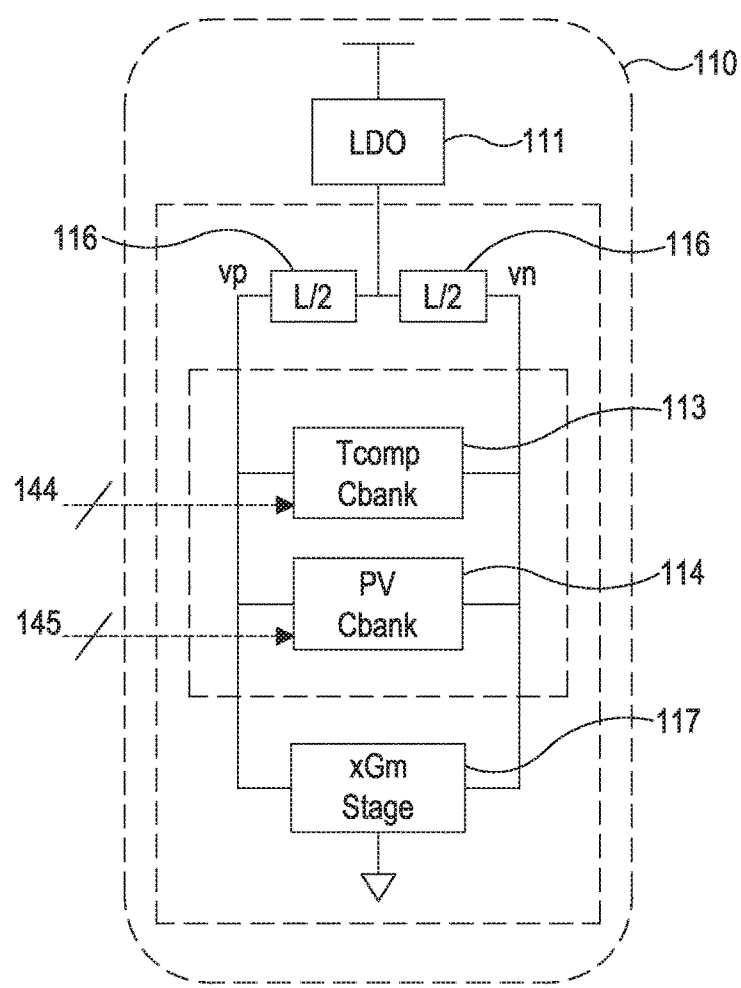
FIG. 3 is a block diagram of an example LC-DCO with a temperature compensation capacitor bank.

FIG. 3 illustrates an example DCO 110 in more detail. The DCO 110 comprises LDO 111, which receives the reference voltage Vref(T) and provides a stabilised supply voltage Vdd_DCO(T) for the LC resonator network of the DCO 110. The supply voltage Vdd_DCO(T) is provided to a node between a pair of matched inductors 116, each contributing half of the total inductance of the LC network. In another embodiments, the supply voltage may be provided to the center tap node of an integrated inductor, the center tap representing the middle point of the inductor L, represented by two identical inductors L/2. The other ends of the inductors 116 are connected to conductors vp, vn, between which the PV capacitor bank 114, the temperature correction capacitor bank 113, and the transconductance cross-coupled stage xGm 117 are each connected, the term x representative of the type (p-type or n-type) of transistor device used.

The temperature compensation capacitor bank 113 is responsive to the control signal 144 from the first controller 140. The digital code of the control signal 144 defines which capacitors of the temperature compensation capacitor bank are included in the LC resonator network.

The PV capacitor bank 114 is similarly responsive to a process variation correction signal 145. The digital code of the process variation correction signal 145 defines which capacitors of the PV capacitor bank are included in the LC resonator network of the DCO 110.

The cross-coupled transconductance stage 117 creates a negative resistance in parallel with the LC network so that the resonance is sustained.

Figure 4:
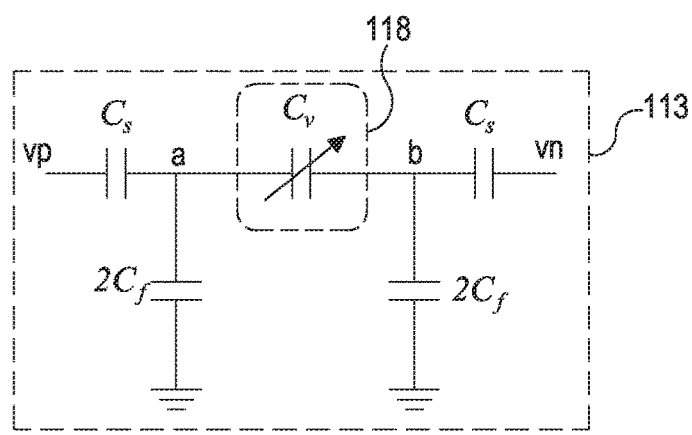
FIG. 4 is a schematic circuit diagram of an example temperature compensation bank, comprising fixed capacitors and a variable capacitance.

FIG. 4 depicts an example temperature compensation capacitor bank 113, comprising a fixed capacitor network and a variable capacitor 118. The variable capacitor $C_v$ 118 is connected between nodes a and b. A pair of matched first and second fixed capacitors $C_s$ is respectively connected between vp and a, and between vn and b. A further pair of fixed matched capacitors $2C_f$ are respectively connected between node a and ground and between node b and ground.

The equivalent capacitance $C_{eq}$ (between vn and vp) of the arrangement shown in FIG. 4 is given by:

$$C_{eq} = C_s(C_v+C_f)/2(C_v+C_f)+C_s$$

The change in capacitance for a given change in the capacitance of the variable capacitor $\Delta C_v$ is given by:

$$\Delta C_{eq} = C_s^2/(2C_v+2C_f+C_s)^2 \times \Delta C_v$$

The fixed capacitors $C_f$ have the effect of reducing the change in equivalent capacitance $C_{eq}$ for a given change in the variable capacitance $C_v$. Fine tuning of the capacitance may thereby be more straightforward to achieve. In some embodiments the capacitors $2C_f$ and/or $C_s$ comprise banks of switchable capacitors/varactors. Varying $C_f$ allows the frequency shift fstep resulting from a switching a varactor in $C_v$ to be adjustable, which may enable improved temperature compensation.

Figure 5:
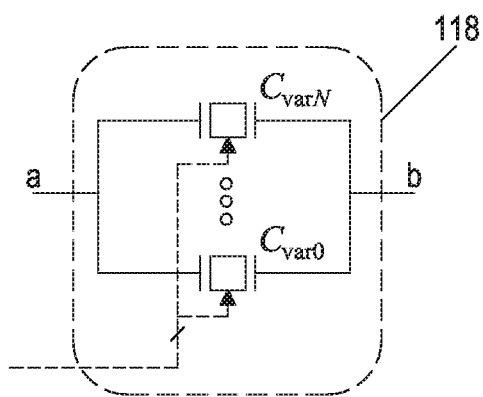
FIG. 5 is a schematic illustrating an example variable capacitance comprising a parallel combination of switched varactors.

The variable capacitor 118 is preferably a set of parallel connected switched varactors $C_{var0}$, $C_{var1}$ ... $C_{varN}$ as depicted in FIG. 5. The varactors $C_{var0}$, $C_{var1}$ ... $C_{varN}$ are each switched by the bits of the digital control signal 144 (either directly or via a decoder).

A varactor is a voltage-controlled capacitor, and a well-known element in electronic circuits. Varactors are operated reverse-biased so no current flows, but since the thickness of the depletion zone varies with the applied bias voltage, the capacitance of the diode can be made to vary. Generally, the depletion region thickness is proportional to the square root of the applied voltage; and capacitance is inversely proportional to the depletion region thickness. Thus, the capacitance is inversely proportional to the square root of applied voltage. The depletion layer may be formed in a MOS device, but the depletion layer can also be made of a p-n-junction or a Schottky diode.

The temperature compensation capacitor bank 118 is preferably insensitive to temperature. The temperature compensation capacitor bank 118 may be designed based on an understanding (e.g. a calculation or simulation) of the temperature dependence of frequency (or the change in capacitance of the other capacitors) of the DCO 110. The range of tuning and the relationship between the digital control signal 144 and the resulting change in capacitance of the temperature compensation bank may be based on a calculated relationship between temperature and change in frequency for the DCO 110. At least some of the varactors $C_{varN}$ may comprise an equal capacitance (for fixed step adjustment of capacitance). At least some of the varactors $C_{varN}$ may be binary weighted, so as to increase the range of adjustment that is possible.

The temperature compensation capacitor bank 118 may comprise a first capacitor bank connected and/or configured to select a size of a fixed step of adjustment of a second capacitor bank.

A suitable varactor bank arrangement for the temperature compensation capacitor bank is disclosed in U.S. Pat. No. 937,721 B1.

Figure 6:
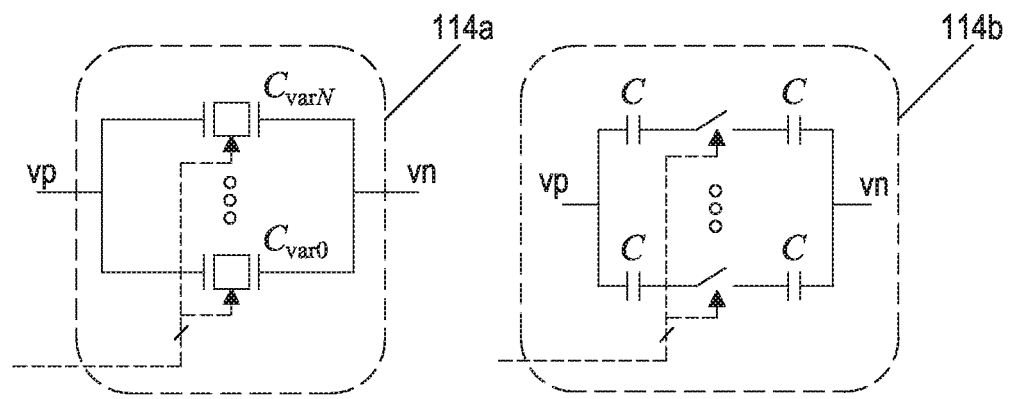
FIG. 6 illustrates two different arrangements for the process variation compensation capacitor bank of FIG. 3, one comprising a switched varactor network, and the other comprising fixed capacitors and switches.

FIG. 6 illustrates two examples of a PV capacitor bank 114a, 114b. The PV capacitor bank 114a comprises a plurality of parallel varactors, similar to that described with reference to FIG. 5, but with the varactors connected between vp and vn (without the network of fixed capacitors). Alternatively, PV capacitor bank 114b comprise a plurality of parallel capacitors that are switched into and out of connection with vp and vn using a switch (e.g. transistor). Each switch is controlled by the digital control signal (either directly or via a decoder). In this example, the switch is in series between a pair of fixed capacitors C. Each switched branch may have a different amount of capacitance e.g. a binary weighted scheme may be used. Alternatively, at least some of the switched capacitances may be equal, to allow for more straightforward monotonic adjustments.

Figure 7:
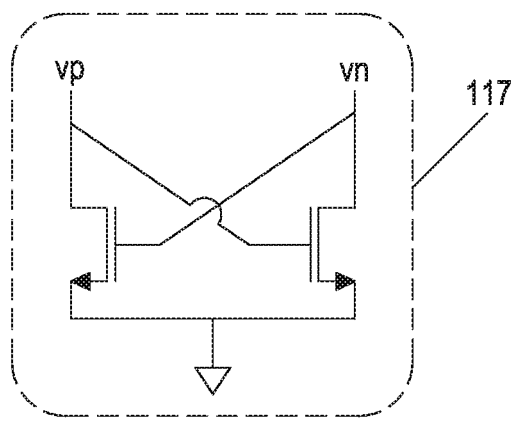
FIG. 7 is a schematic circuit diagram of a transconductance amplification stage of the LC-DCO of FIG. 3.

FIG. 7 illustrates an example of cross-coupled transconductance stage, comprising a pair of cross connected NMOS transistors. One of the transistors has its drain connected to vp, its gate connected to vn and its source connected to ground. The other transistor has its drain connected to vn, its gate connected to vp and its source connected to ground.

Figure 8:
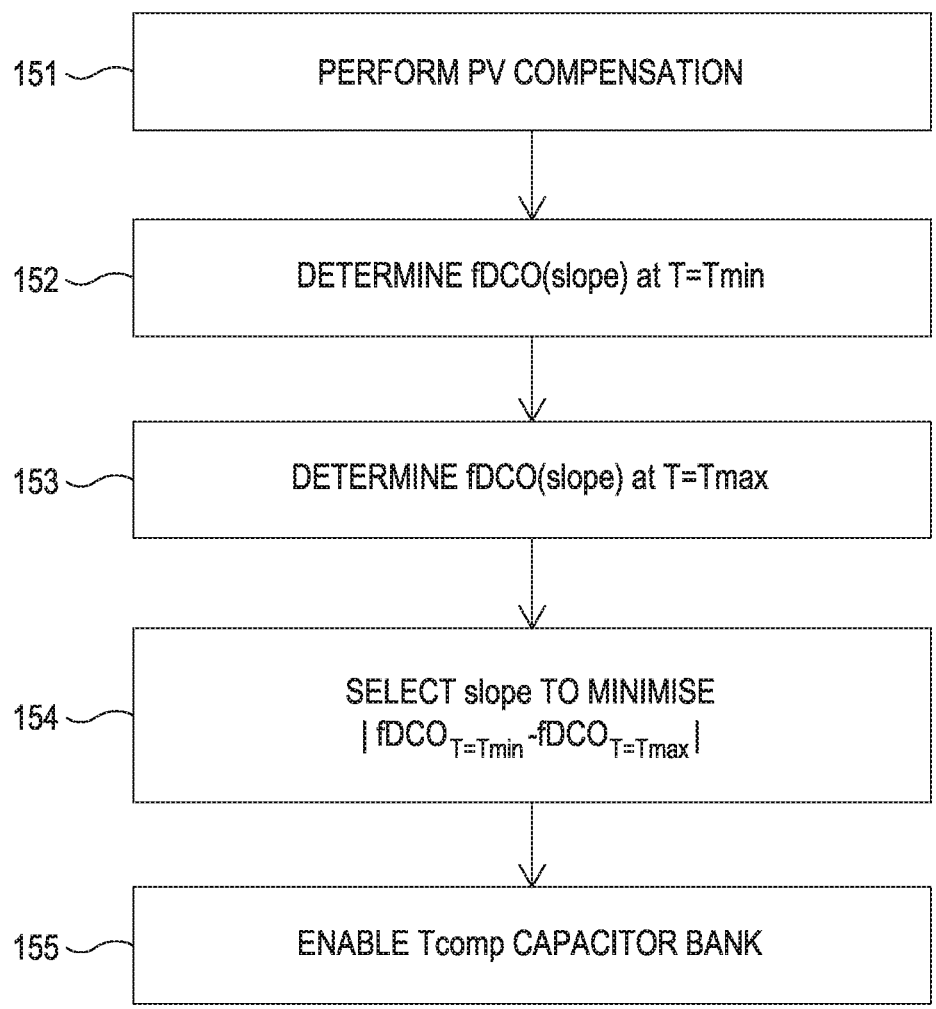
FIG. 8 is an example method of correcting a DCO output frequency for temperature variation.

FIG. 8 illustrates an example method of calibrating a device in accordance with an embodiment. The first step is to perform PV compensation, using the PV capacitor bank 114. The PV compensation may be based on a measured output frequency of the DCO 110, and the control signal applied to the PV capacitor bank 114 may be selected to provide an output frequency that is as close as possible to a desired value at a selected temperature. The temperature compensation bank 118 may be set to mid-code (i.e. in the middle of its tuning range) during the PV compensation step.

The selected temperature (which may correspond with the break-point mentioned above) may be the middle of the operating temperature range. The operating temperature range may be defined by a high temperature (e.g. 120 degrees C.) and a low temperature (e.g. −40 degrees C.). The mid-point temperature may be 40 degrees C.

The frequency change fstep resulting from a step (e.g. switching in and out the least significant varactor) of the temperature compensation bank may be determined after the PV compensation is performed.

As already mentioned above, the relationship Vref(T) may be a linear relationship defined by a slope. Conveniently, changing the slope does not result in a change in the reference voltage when the temperature is at the mid-point temperature (i.e. the slope is adjustable about the midpoint temperature). This means that changing the slope of Vref(T) will affect the supply voltage to the DCO at the high temperature and the low temperature.

The temperature of the DCO may be reduced to the low temperature, and the slope of the voltage reference Vref(T) varied while the output frequency is measured. The relationship between the DCO output frequency at the low temperature and the slope may thereby be determined.

The temperature of the DCO may be increased to the high temperature, and the slope of the voltage reference Vref(T) varied while the output frequency is measured. The relationship between the DCO output frequency at the high temperature and the slope may thereby be determined.

In a subsequent step, a slope that minimises the difference (in an absolute sense) between the frequency output from the DCO at the high and low temperature is selected. This slope will substantially cancel linear frequency error (or at least reduce it as much as possible).

The non-linear error in a typical LC-DCO may be substantially quadratic (as discussed above). After performing the steps described above, the frequency at the mid-point temperature is known, and the frequency at the low temperature and high temperature are known. The linear error can be assumed to be zero, and a quadratic function can therefore be fitted to the frequencies at low, mid and high temperatures. The control logic 142 may be configured to receive the temperature signal and break point signal (corresponding with the mid-point temperature) and to provide a signal to the temperature compensation bank that causes a change in capacitance that substantially cancels the quadratic error function in the frequency (e.g. based on knowledge of the frequency step fstep). Enabling the temperature compensation bank will subsequently substantially reduce the non-linear frequency error.

Figure 9:
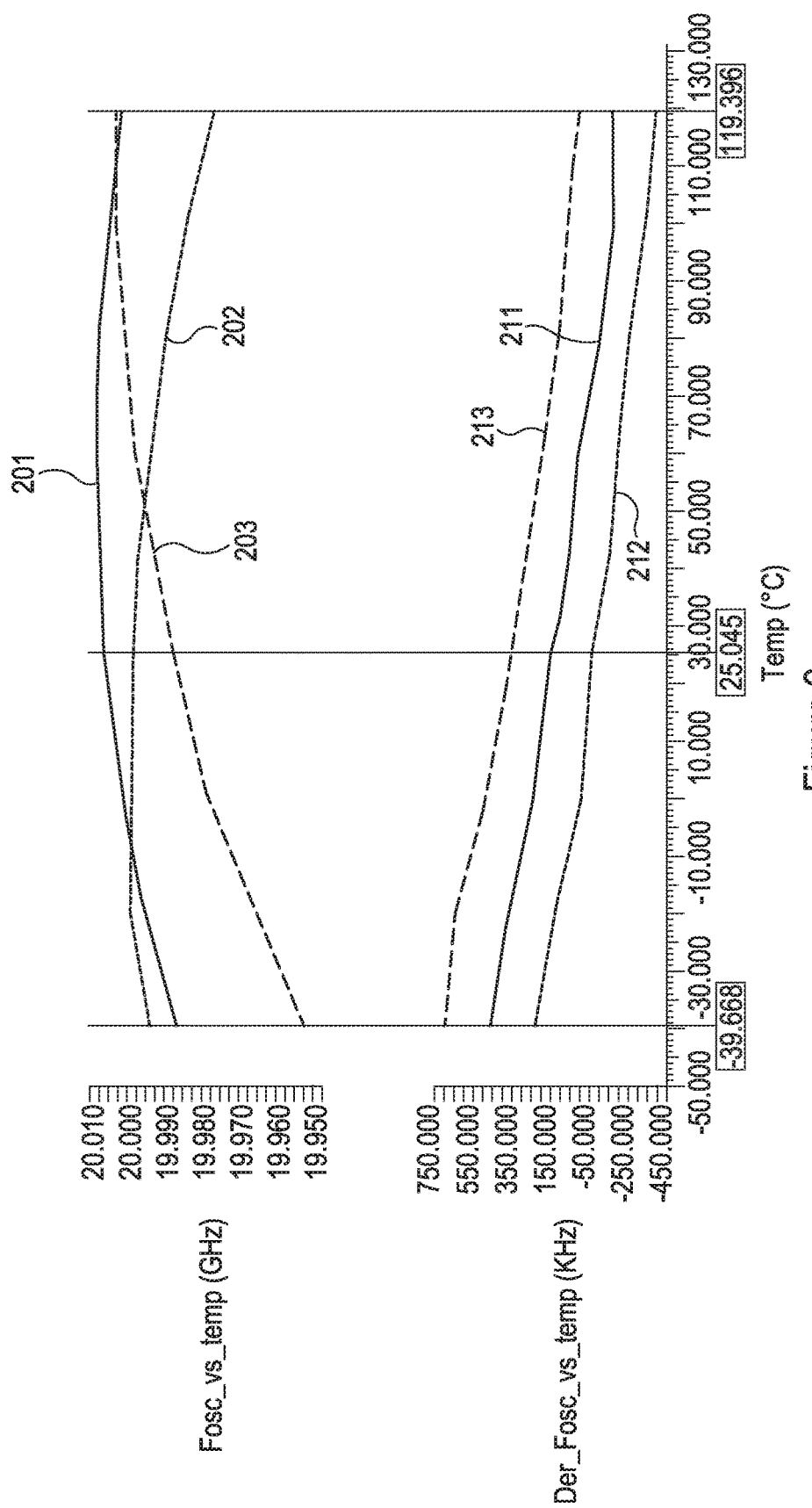
FIG. 9 is a graph showing simulated output frequency with respect to temperature and a further graph showing the differential of output frequency with respect to temperature for three DCOs with different temperature sensitivity ("fast", "typical" and "slow")

FIG. 9 shows an example of a simulation of three different DCOs. Lines 201, 202, 203 are shown of frequency vs temperature for a "slow" frequency error of −1000 ppm/K, a "typical" frequency error of +1000 ppm and a "fast" frequency error of +2500 ppm/K respectively. The differential of the frequency with respect to temperature for the same three lines 211, 212, 213 are plotted below ("fast"=211, "typical"=212, "slow"=213). It can be seen that the differential plots are substantially linear, indicating that the non-linear component of frequency error is dominated by the quadratic error. The difference between the frequency at the high temperature (of 120 degrees C.) and the low temperature (of −40 degrees C.) is −22 MHz, +12 MHz and +55 MHz for "slow", "typical" and "fast" simulations respectively. The design frequency in this example is approximately 20 GHz.

Figure 10:
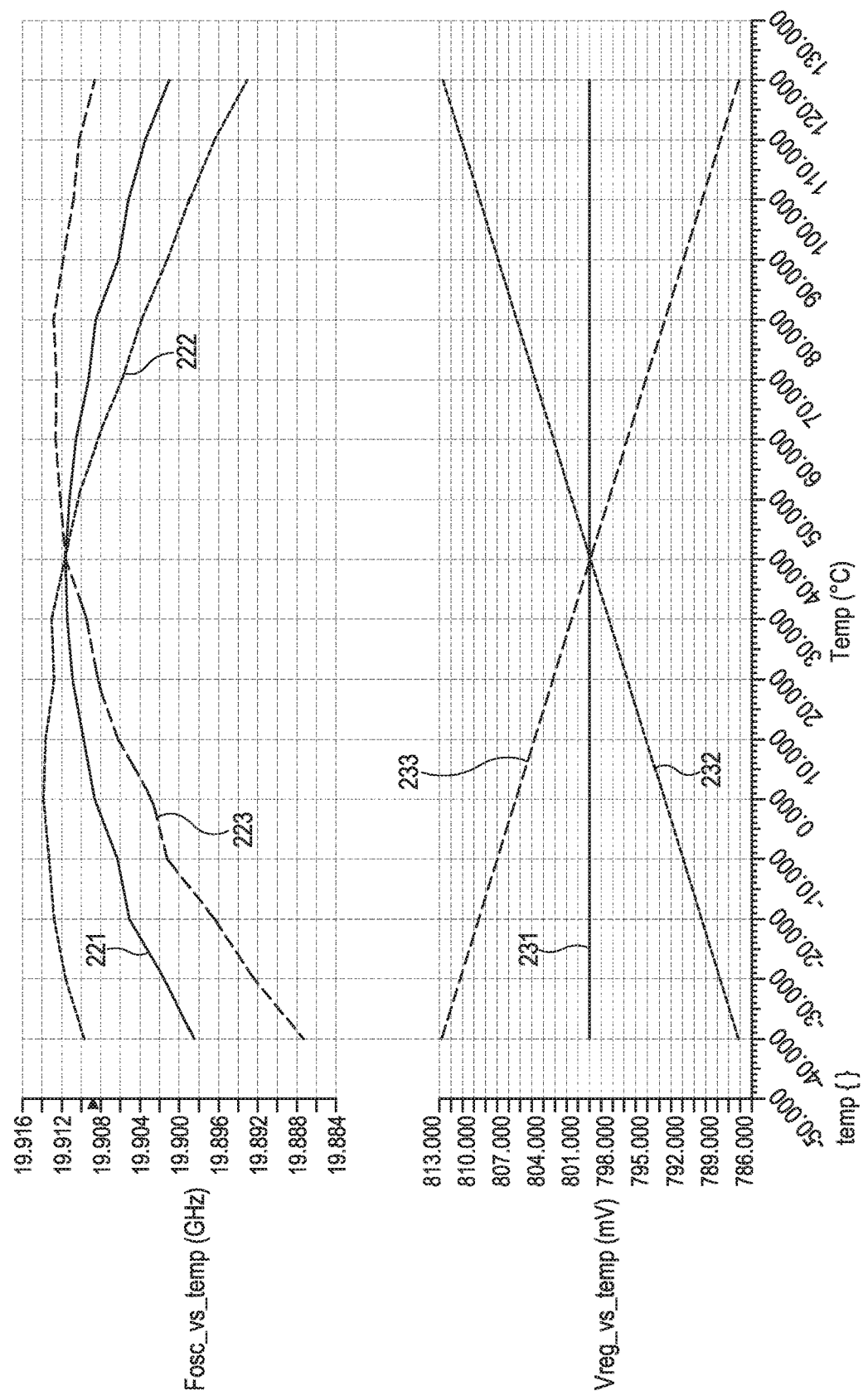
FIG. 10 is a graph showing simulated output frequency with respect to temperature for three different voltage reference slopes.

FIG. 10 shows how frequency as a function of temperature varies as different voltage reference slopes are used. For illustration, the "typical" DCO is used, and the frequency vs temperature is plotted for three different slopes. The voltage slopes are illustrated on the lower graph, with line 231 showing a 0ppm slope (constant 800 mV supply), line 232 showing a +200 ppm/K slope (800 mV at 40 degrees C.) and line 233 showing a −200 ppm/K slope (again, 800 mV at 40 degrees C.). The resulting output frequency vs temperature relationship is shown in the upper graph, with line 221 corresponding with 0 ppm/K, line 222 corresponding with +200 ppm/K, and line 223 corresponding with −200 ppm/K. In this example, the slope of 0 ppm/K minimises the difference between the frequency at high and low temperatures. The remaining error is substantially symmetrical, and can be removed with the temperature compensation capacitor bank.

Figure 11:
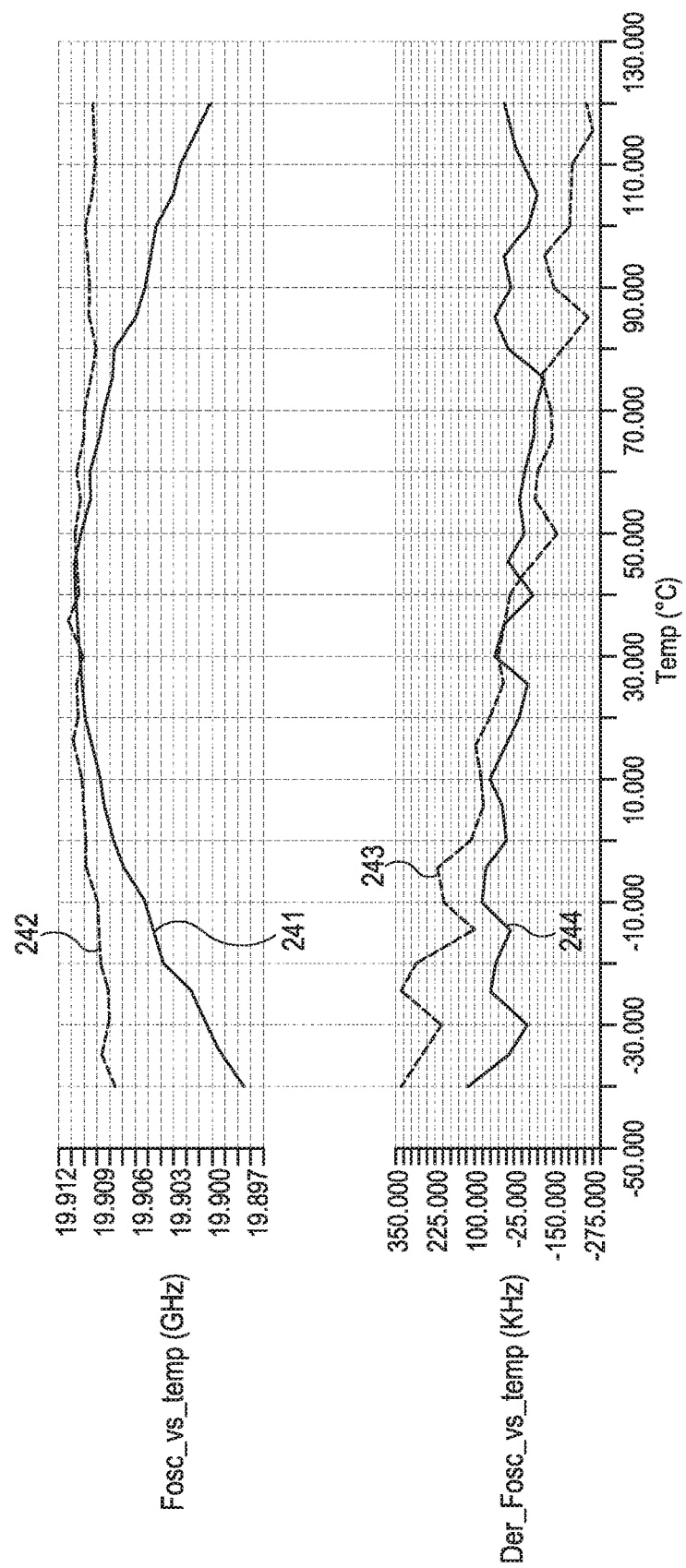
FIG. 11 is a pair of graphs showing simulated temperature compensation for a DCO with "typical" temperature sensitivity.

FIG. 11 illustrates the result of enabling correction with the temperature compensation capacitor bank for the DCO simulated in FIG. 10. In this example the code applied to the PV capacitor bank to center the output frequency was coarse=10, medium=8, fine=0. Line 241 shows frequency vs temperature without the capacitor bank enabled (the same data as line 221, slope=0 ppm, "typical" error). Line 242 shows frequency vs temperature with the capacitor bank enabled. Lines 243 and 244 respectively show the frequency error (in ppm) without and with the temperature compensation capacitor bank enabled. Without the temperature compensation capacitor bank enabled, the error ($f_{max}$-$f_{min}$) over the temperature range is 667 ppm, and with it enabled, the error is limited to only 170 ppm.

Figure 12:
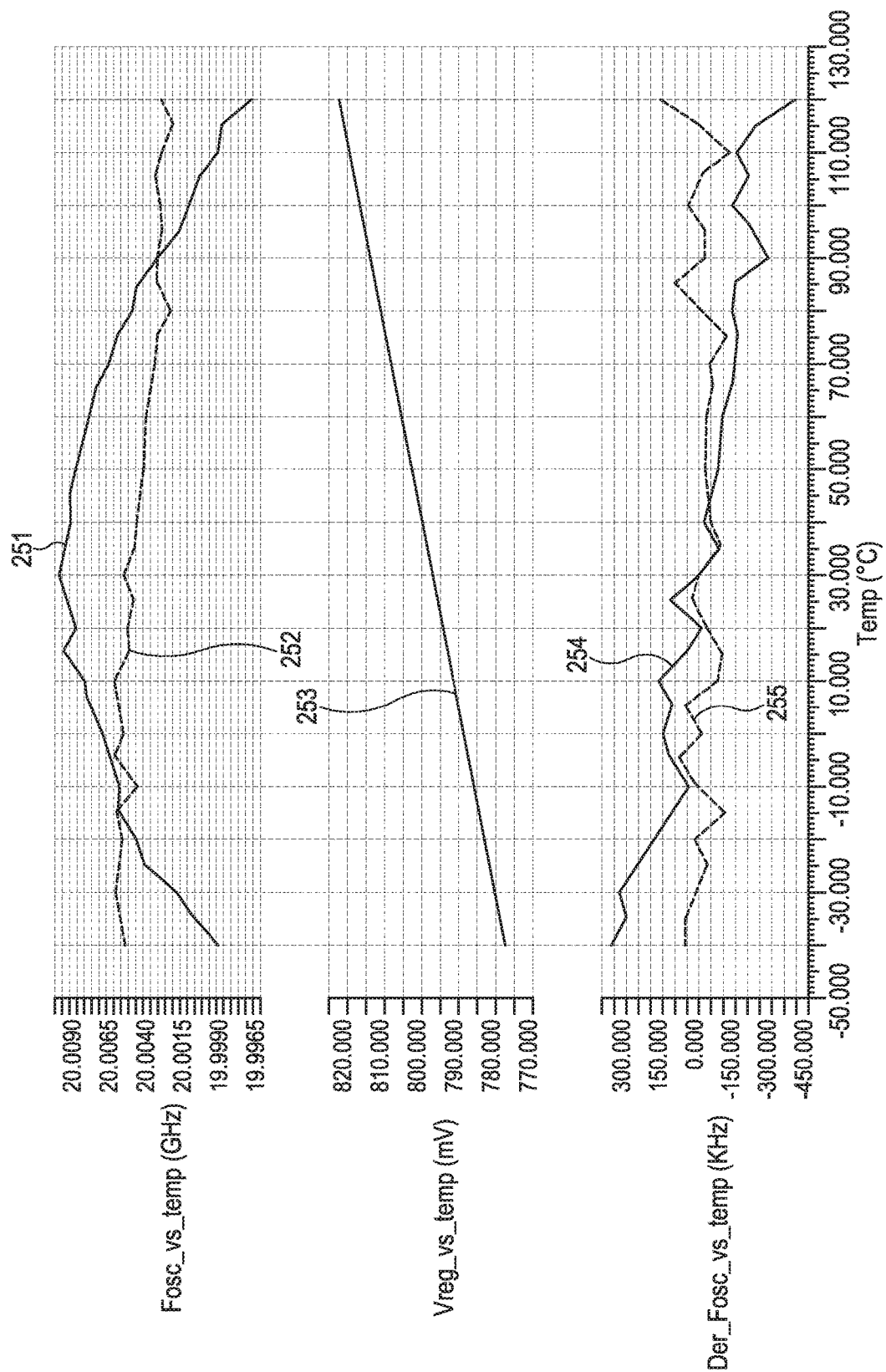
FIG. 12 comprises graphs showing simulated temperature compensation for a DCO with "fast" temperature sensitivity.

FIG. 12 illustrates the result of enabling correction with the temperature compensation capacitor bank for a "fast" DCO. In this example the code applied to the PV capacitor bank to center the output frequency was coarse=13, medium=7, fine=0. Line 251 shows frequency vs temperature without the capacitor bank enabled, with a voltage supply slope of +350 ppm (as shown in line 253). Line 252 shows frequency vs temperature with the capacitor bank enabled. Lines 254 and 255 respectively show the frequency error (in ppm) without and with the temperature compensation capacitor bank enabled. Without the temperature compensation capacitor bank enabled, the error ($f_{max}$-$f_{min}$) over the temperature range is 626 ppm, and with it enabled, the error is limited to only 199 ppm.

Figure 13:
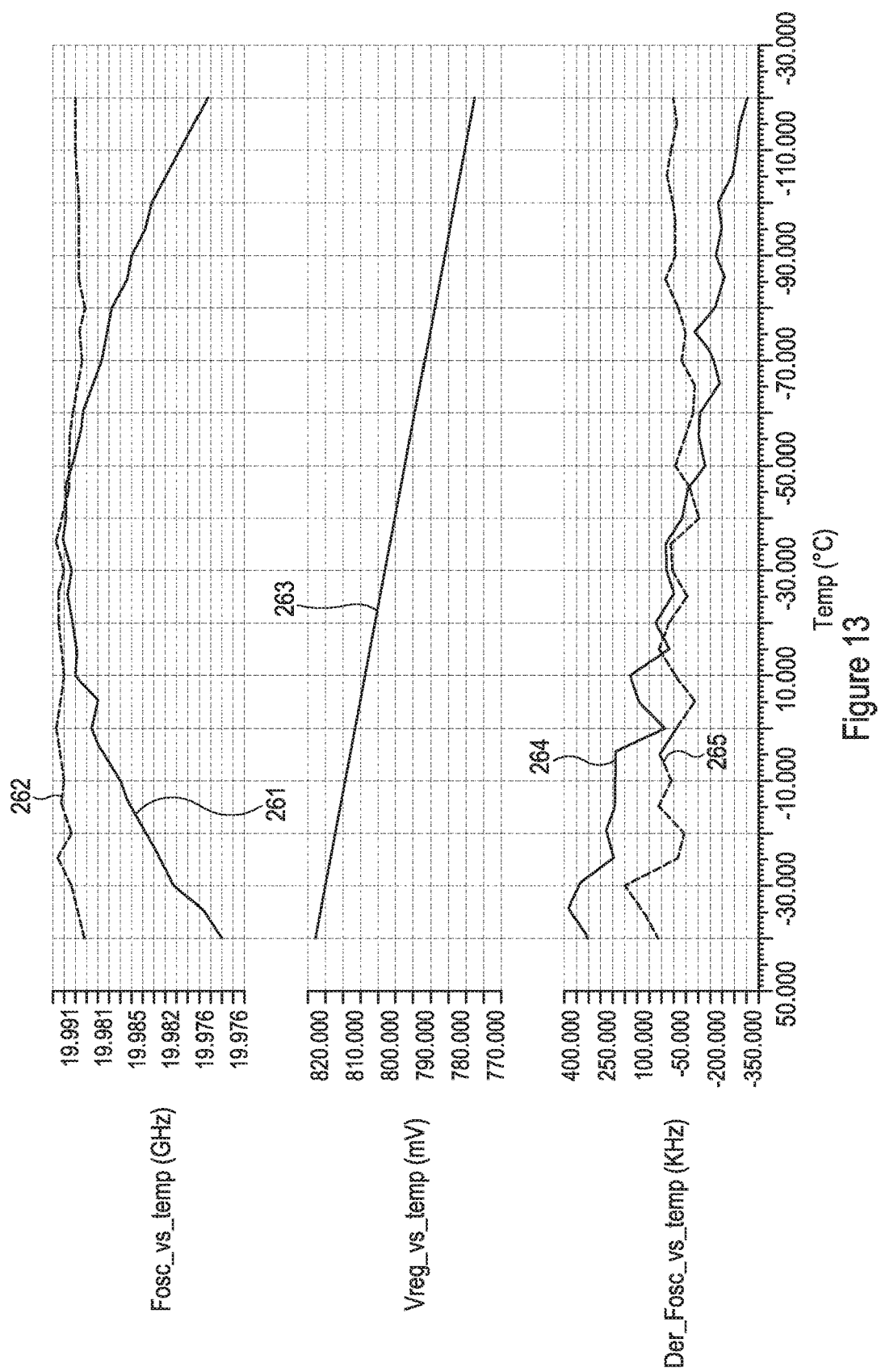
FIG. 13 comprises graphs showing simulated temperature compensation for a DCO with "slow" temperature sensitivity.

FIG. 13 illustrates the result of enabling correction with the temperature compensation capacitor bank for a "slow" DCO. In this example the code applied to the PV capacitor bank to center the output frequency was coarse=3, medium=0, fine=0. Line 261 shows frequency vs temperature without the capacitor bank enabled, with a voltage supply slope of −350 ppm (as shown in line 263). Line 262 shows frequency vs temperature with the capacitor bank enabled. Lines 264 and 265 respectively show the frequency error (in ppm) without and with the temperature compensation capacitor bank enabled. Without the temperature compensation capacitor bank enabled, the error ($f_{max}$-$f_{min}$) over the temperature range is 720 ppm, and with it enabled, the error is limited to only 128 ppm.

One application for a DCO according to the according to the disclosure may be a phase locked loop as a clock generator (e.g. with <500 ppm/K drift).

From reading the present disclosure, other variations and modifications will be apparent to the skilled person. Such variations and modifications may involve equivalent and other features which are already known in the art of phase locked loops, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. A device comprising:
   a voltage reference supply, configured to provide a reference voltage that varies in response to temperature according to a predefined relationship;
   a temperature sensor providing a temperature signal indicating a temperature;
   a first controller configured to receive the temperature signal and to output a control signal, the first controller comprising:
      a break point tracking module configured to compare the temperature signal with a bandgap reference voltage and to output a break point signal, wherein the bandgap reference voltage indicates a temperature break point, and
      a logic control circuit configured to output the control signal based on the temperature and the break point signal, wherein
         the control signal increases in value as the temperature increases until the break point is reached,
         the control signal decreases in value as the temperature increases after the break point is reached;
   an LC-DCO (digitally controlled oscillator) receiving the reference voltage and providing an output signal with a frequency from an inductor-capacitor (LC) circuit, the LC-DCO comprising a switched capacitor bank configured to provide temperature compensation by varying an effective capacitance in the LC circuit in response to the control signal.

2. The device of claim 1, wherein the voltage reference supply comprises a programmable slope voltage generator.

3. The device of claim 1, wherein the predefined relationship comprises a substantially linear relationship, so that the reference voltage varies substantially linearly in response to changes in temperature.

4. The device of claim 1, wherein the switched capacitor bank and first controller are configured to correct a non-linear frequency error in response to temperature and the predefined relationship is selected to correct a linear frequency error in response to temperature.

5. The device of claim 4, wherein the non-linear frequency error is substantially quadratic.

6. The device of claim 1, wherein the switched capacitor bank has a capacitive divider topology.

7. The device of claim 1, wherein the switched capacitor bank comprises a plurality of switched varactors.

8. The device of claim 1, wherein the LC-DCO comprises a low dropout regulator LDO, the LDO configured to receive the reference voltage and to provide a supply voltage for the LC-DCO.

9. The device of claim 1, wherein the temperature sensor is configured to provide an analog temperature signal, and the first controller comprises an analog to digital converter.

10. The device of claim 1, wherein the first controller is configured to output a digital control signal, and the switched capacitor bank is configured to vary the effective capacitance in response to the digital control signal.

11. The device of claim 1, further comprising a second controller, configured to provide a second control signal to the voltage reference supply that defines the predefined relationship.

12. The device of claim 1, wherein the temperature sensor comprises:
   a first current generator configured to generate a current proportional to absolute temperature (PTAT current);
   a second current generator configured to generate an inverse current proportional to absolute temperature (IPTAT current), the PTAT current and the IPTAT current being combined to form a reference current having a temperature sensitivity;
   a plurality of current mirrors to adjust the sensitivity and gain of the reference current; and
   a variable resistor to set the temperature signal based on the generated current.

13. A method of correcting a frequency variation in an output signal of a DCO (digitally controlled oscillator) in response to a temperature variation, comprising:
   receiving, by the DCO, a reference voltage that varies in response to temperature according to a predefined relationship;
   receiving, by the DCO, a control signal based on a temperature signal indicating a temperature and a break point signal indicating a temperature break point, wherein
      the control signal increases in value as the temperature increases until the break point is reached, and
      the control signal decreases in value as the temperature increases after the break point is reached; and
   providing, by the DCO, an output signal with a frequency from an inductor-capacitor (LC) circuit of the DCO, wherein the providing comprises:
      in response to the control signal, varying an effective capacitance in the LC circuit of the DCO using a switched capacitor bank to provide temperature compensation.

14. The method of claim 13, further comprising:
   setting the predefined relationship so as to minimise, when the temperature compensation using the switched capacitor bank is disabled, the difference between the frequency of the output signal at a low temperature and the frequency of the output signal at a high temperature;
   enabling temperature compensation using the switched capacitor bank.

15. The method of claim 14, wherein setting the predefined relationship comprises:
   determining the frequency of the output signal at a low temperature for each of a plurality of different predefined relationships;
   determining the frequency of the output signal at a high temperature for each of the plurality of different predefined relationships;
   selecting the predefined relationship that results in the smallest difference in the frequency of the output signal between the high and low temperatures.

16. The method of claim 14, further comprising:
   at a mid-point temperature, setting the switched capacitor bank to mid-code, and adjusting the output signal frequency to match a desired frequency.

* * * * *